United States Patent
Ramkumar et al.

[11] Patent Number: 6,033,991
[45] Date of Patent: Mar. 7, 2000

[54] ISOLATION SCHEME BASED ON RECESSED LOCOS USING A SLOPED SI ETCH AND DRY FIELD OXIDATION

[75] Inventors: Krishnaswamy Ramkumar; Pamela Trammel, both of San Jose; Sharmin Sadoughi, Cupertino, all of Calif.

[73] Assignee: Cypress Semiconductor Corporation, San Jose, Calif.

[21] Appl. No.: 08/939,838

[22] Filed: Sep. 29, 1997

[51] Int. Cl.[7] .................................................. H01L 21/302
[52] U.S. Cl. ............................................ 438/713; 438/717
[58] Field of Search .................................... 438/713, 712, 438/723, 770; 216/87

[56] References Cited

U.S. PATENT DOCUMENTS

| | | | |
|---|---|---|---|
| 4,671,849 | 6/1987 | Chen et al. | 438/713 |
| 5,358,893 | 10/1994 | Yang et al. | 438/448 |
| 5,393,694 | 2/1995 | Matthews | 438/448 |
| 5,429,714 | 7/1995 | Tuan et al. | 216/87 |
| 5,658,822 | 8/1997 | Wu et al. | 438/448 |
| 5,672,539 | 9/1997 | Thakur et al. | 438/443 |

*Primary Examiner*—Felisa Hiteshew
*Assistant Examiner*—Bernadine Okoro
*Attorney, Agent, or Firm*—Oblon, Spivak, McClelland, Maier & Neustadt, P.C.

[57] ABSTRACT

A method of forming a field oxide or an isolation region in a semiconductor die. An oxidation mask layer (over an oxide layer disposed over the substrate) is patterned and subsequently etched, preferably so that the oxidation mask layer may have a nearly vertical sidewall. The oxide layer and the substrate in the isolation region are etched to form a recess in the substrate having a sloped surface with respect to the sidewall of the oxidation mask layer. A field oxide is then grown in the recess using a dry oxidizing atmosphere. The sloped sidewall of the substrate recess effectively moves the face of the exposed substrate away from the edge of the oxidation mask layer sidewall. Compared to non-sloped techniques, the oxidation appears to start with a built-in offset from the patterned etch. This leads to a reduction of oxide encroachment and less field oxide thinning. The preferred range of slopes for the substrate sidewall is from approximately 10° to 40° with respect to the oxidation mask layer sidewall.

20 Claims, 5 Drawing Sheets

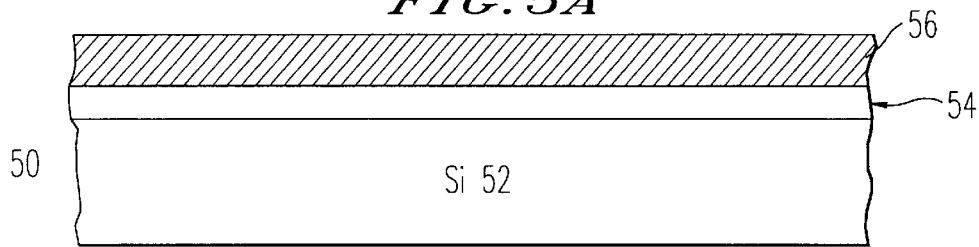
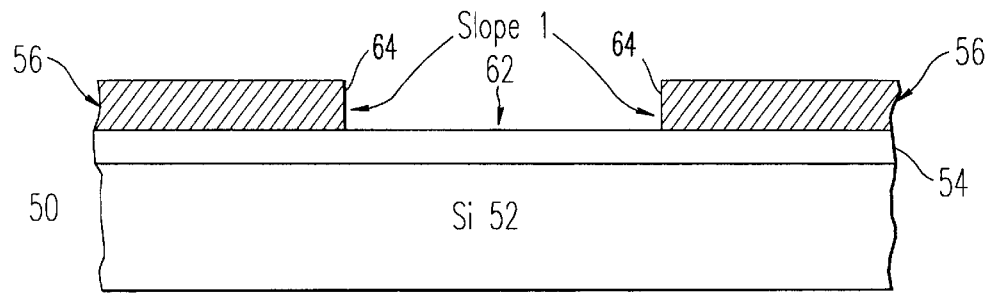
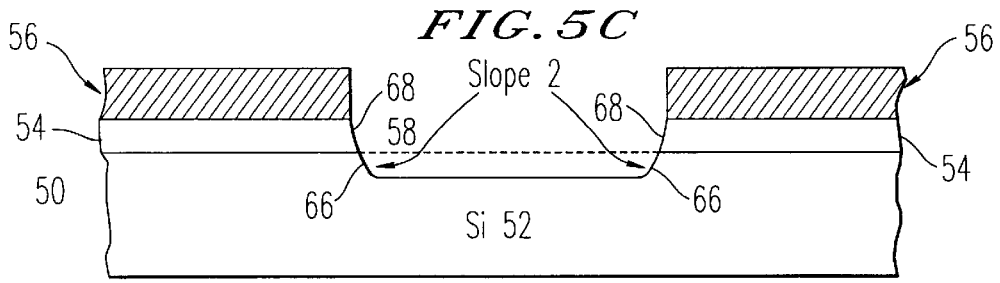
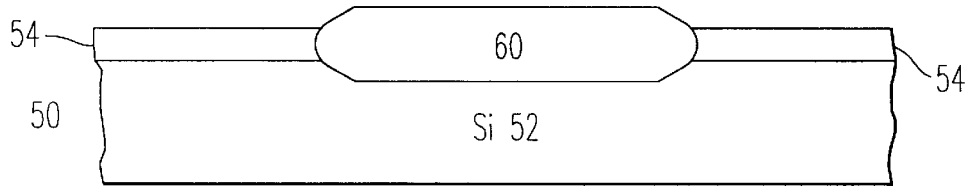

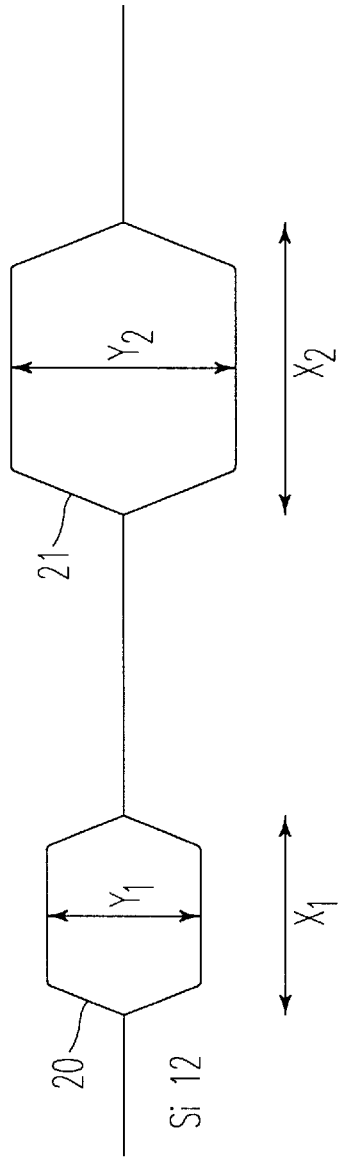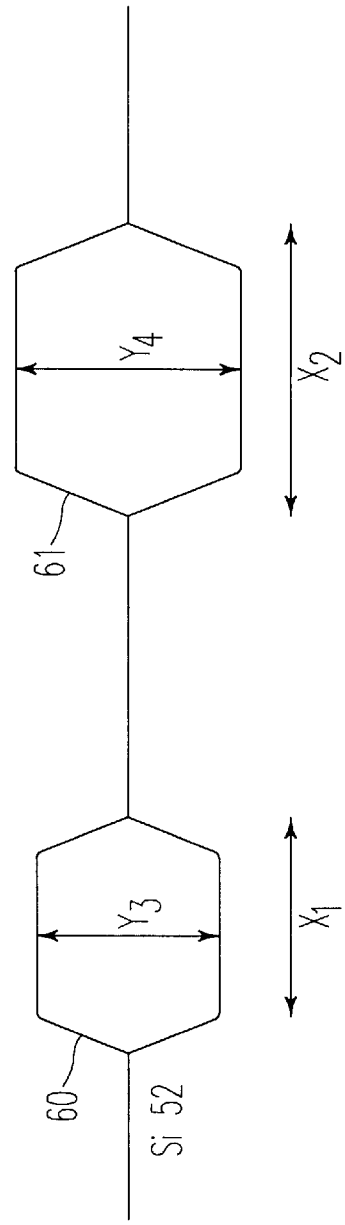

ISOLATION SCHEME BASED ON RECESSED LOCOS USING A SLOPED SI ETCH AND DRY FIELD OXIDATION

BACKGROUND OF THE INVENTION

1. Field of the Invention

The present invention relates to a method of forming local oxidation isolation structures in semiconductor and/or integrated circuit devices and, more particularly, to a method of forming such isolation structures that reduces stress-related defects and that results in a significantly less field oxide "thinning".

2. Discussion of the Background

Integrated circuits (ICs) have electric circuits which comprise a number of isolated devices, e.g., transistors, interconnected through one or more conducting paths. To fabricate ICs, individual devices must be created in a silicon substrate in such a way that they are electrically isolated from one another. Isolation of individual devices ensures that the state (e.g., on or off) and conductance of the individual devices are independently controlled. Without proper isolation, leakage currents may occur, causing power dissipation, noise margin degradation and/or voltage shifts on dynamic nodes. In CMOS circuits, leakage current may lead to device latch up, which can damage the integrated circuit. Further, without proper isolation, cross-talk between devices may occur, thereby disturbing the logic state of a logic gate which is made up of a number of the individual devices.

Integrated circuit designers face other challenges that may conflict with the desire for proper isolation. For example, it is commercially important to make the spacing between individual components or devices as small as possible to enable an increase in device density (e.g., number of devices per unit area). Furthermore, there is also a strong desire in the art to ensure that the fabrication processes which are used to produce the isolation structures are simple to implement and control. At the same time, these processes should not adversely impact the characteristics of active areas of the semiconductor die which will form the integrated circuit.

To meet these and other challenges in manufacturing semiconductor devices, Local Oxidation of Silicon (LOCOS) has become a widely used processing step in forming lateral isolation structures between devices (e.g., transistors) on a semiconductor die. Indeed, the LOCOS process has become the "work horse" isolation technology for MOS devices down to about 0.5 $\mu$m geometries. LOCOS processes are popular, in part, because they produce a fairly planar surface which is highly desirable for resolving and patterning dense features on a semiconductor die.

FIG. 1 illustrates a semiconductor die 10 at one stage of a conventional LOCOS process. A thin layer of a pad oxide 14 of approximately 10 to 50 nm thickness is formed on the surface of a silicon substrate 12. Next, a thicker layer of silicon nitride 16 is deposited on the pad oxide layer 14. The silicon nitride layer 16 may be approximately 100 to 150 nm thick and may be deposited using conventional chemical vapor deposition (CVD) techniques.

In the resulting structure, the pad oxide layer 14 is used to cushion the transition of stresses between the silicon substrate 12 and the nitride layer 16. Such stresses may occur in the nitride layer 16 due to various effects, including: (1) a mismatch between the thermal coefficients of expansion of the nitride layer 16 and the silicon substrate 12; and (2) a tendency of the growing field oxide (see below) to lift the edges of the nitride layer 16. Such stresses may cause the nitride layer 16 to crack as the field oxide layer is grown, thus defeating the purpose of the nitride layer 16 as an oxidation barrier.

Stresses may also be transmitted from the nitride layer 16 to the silicon substrate 12. These stresses may produce defects in the silicon crystal. In general, the thicker the pad oxide layer 14, the fewer the defects in both the nitride layer 16 and the silicon substrate 12 during the field oxide layer growth. However, a thick pad oxide layer 14 may render the nitride layer 16 less effective as an oxidation mask by allowing lateral oxidation to take place. Consequently, the thinnest pad oxide layer 14 that effectively relieves stress is generally employed.

After the nitride layer 16 is deposited, it may be patterned, for example by using conventional photolithography techniques wherein a photoresist layer (not shown) is spun on and exposed through a mask. As shown in FIG. 2, the nitride layer 16 and pad oxide layer 14 may then be etched to expose a top surface of the silicon substrate 12 in a region 18 that will become an isolation structure. In other words, the nitride layer 16 and pad oxide layer 14 are patterned so that after the etch they remain only over what will become the active regions in the silicon substrate 12.

With the region 18 still exposed, the silicon substrate 12 is oxidized to form a field oxide region 20 of desired thickness. The result is shown in FIG. 3 where a field oxide region 20 has been grown over silicon substrate 12. Even though this oxide grows mainly in areas where the silicon nitride layer 16 is absent, the oxide generally grows by diffusion, resulting in both vertical growth in the isolation region and lateral growth under the nitride and pad oxide layers 16 and 14. This lateral growth of the field oxide results in a so-called "bird's beak" because the shape of the oxide grown under the nitride resembles that of a bird's beak. Because it is the beak-to-beak distance "X" (see FIG. 7), over the silicon substrate 12 which will define the active transistor area, the smaller the bird's beak, the closer the devices (e.g., transistors) can be packed onto a given substrate. In other words, bird's beak encroachment leads to active areas that are narrower than originally patterned and isolation regions which are wider than originally patterned. What is desired is as small a bird's beak as possible, while maintaining electrical isolation between active areas.

A fundamental limitation of the LOCOS scheme is the "thinning" of the field oxide in narrow regions. This thinning occurs due to the high stresses generated during the growth of the oxide in narrow openings. It results in a significantly thinner oxide growth in narrow areas (0.5 $\mu$m or less) as compared to wide areas (>2 $\mu$m). The thinning effect becomes more severe as the width of the narrow region decreases. The thinning of the field oxide gives rise to reduction in field threshold voltages which degrades the isolation between adjacent devices. Thinning effects provide for a field oxide having greater dimensions than a field oxide which does not display thinning, without a significant increase in the electrical insulating properties of the field oxide. The result is a lose of "real estate" since the increased dimensions of the field oxide are without substantial increase in the electrical isolation of active areas.

Another drawback of conventional LOCOS is that it is susceptible to defects caused by the high stresses generated in the narrow active areas, underneath the nitride layer, during field oxidation. There are also defects caused by the KOOI effect. These defects can degrade the gate oxide quality and transistor performance. Defect generation is enhanced as the geometries shrink and the bird's beak encroachment becomes a more significant portion of the field oxide surface area. What is desired, therefore, is a means of forming an isolation region in a semiconductor substrate that does not have the drawbacks and shortcomings of conventional methods and/or known variations thereof, and that is useful for isolating integrated circuits devices (e.g. transistors) having a geometry (e.g. gate width) of 0.35 μm or less.

SUMMARY OF THE INVENTION

One object of the present invention relates to a method of forming an isolation region in a semiconductor wafer or die.

Another object of the present invention relates to a semiconductor wafer or die comprising such an isolation region.

These and other objects of the present invention are made possible by a method in which a portion of the substrate of a semiconductor die is etched to form an isolation region having a sloped sidewall with respect to the sidewall of an oxidation mask layer, relative to regions(s) of the substrate other than the isolation region. The semiconductor die generally includes a semiconductor substrate (preferably comprising silicon), an oxide layer thereon, and an oxidation mask layer on the oxide layer. The oxidation mask and oxide layers are patterned and subsequently etched so that the isolation region is adjacent to active region(s) of the substrate and an oxidation mask layer thereover (preferably having a nearly vertical sidewall). The etch step may be continued, or one or more separate etching steps may be conducted, to etch the exposed substrate and form the isolation region having the sloped sidewall. A field oxide is then grown in the isolation region using a dry, oxidizing atmosphere, ambient and/or environment at high temperature in the range 1,100° C. to 1,200° C. A dry ambient during oxidation results in reduced lateral oxidation and less thinning in narrow openings.

The sloped sidewall of the substrate in the isolation region effectively moves the face of the exposed silicon away from the edge produced by patterning and etching of the oxidation mask layer. When compared to a non-sloped sidewall region, the encroaching oxidation starts with a built-in offset from the patterning etch. This leads to a reduction of oxide encroachment and may result in a nearly non-existent bird's beak. The desirable range of slopes for the sidewall of the substrate in the isolation region is approximately 10°–40° with respect to a plane defined by the oxidation mask layer sidewall (or alternatively, approximately 50–80° with respect to a horizontal plane defined by the (roughly) planar surface of the substrate at the base of the isolation region).

The reduced oxide encroachment, due to the sloped sidewall and the dry oxidation, results in reduced stresses in the oxidation mask and hence reduces the formation of defects in the underlying silicon. The dry ambient during oxidation also prevents KOOI defects (which are a result of the interaction between the oxidation mask and the steam used in conventional [wet] oxidation). Reduced oxide encroachment also provides for more effective isolation of active regions than a field oxide of equivalent dimensions, displaying thinning. Consequently, a field oxide of smaller dimensions may be fabricated, while maintaining effective electrical isolation of active regions.

BRIEF DESCRIPTION OF THE DRAWINGS

The present invention is illustrated by way of example, and not limitation, in the figures of the accompanying drawings in which:

FIGS. 5(*a*)–5(*d*) illustrate the formation of an isolation region according to one embodiment of the present invention;

FIGS. 8(*a*) and 8(*b*) illustrates the reduction in the thinning effect for narrow openings.

DESCRIPTION OF THE PREFERRED EMBODIMENTS

Figure 1:
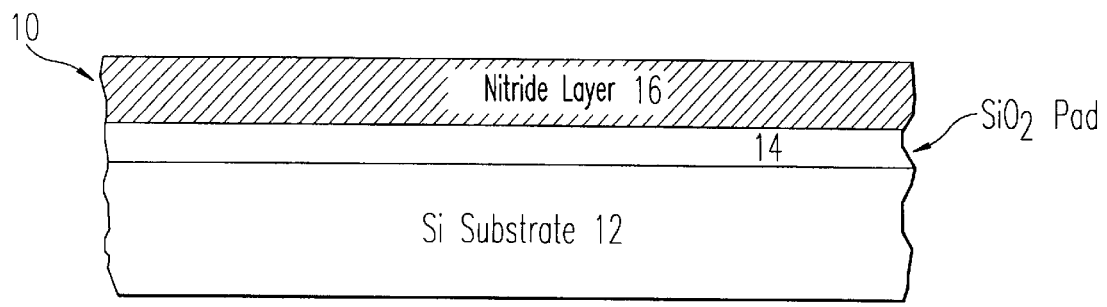
FIG. 1 illustrates a cross-section of a portion of a semiconductor die at an initial stage of a conventional LOCOS process.
Figure 2:
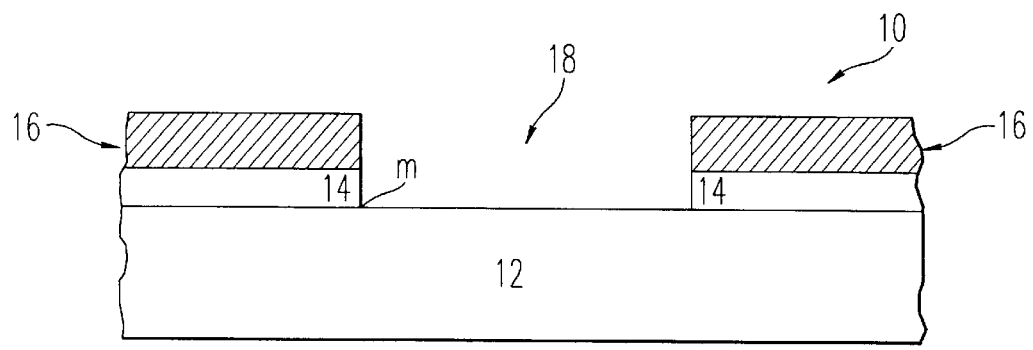
FIG. 2 illustrates the semiconductor die of FIG. 1 at a further stage of the conventional LOCOS process.
Figure 3:
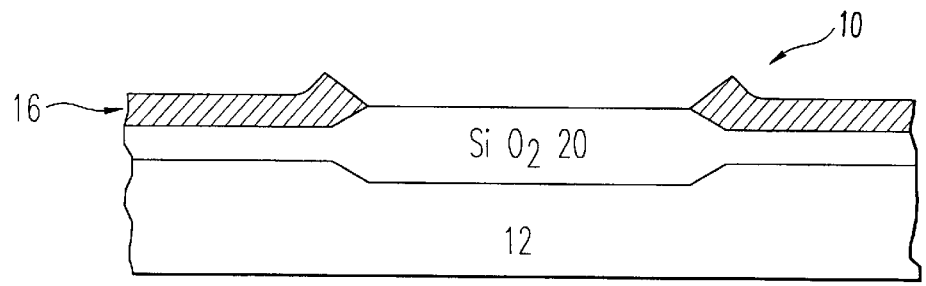
FIG. 3 illustrates the semiconductor die of FIG. 1 having an isolation region formed according to the conventional LOCOS process.
Figure 4:
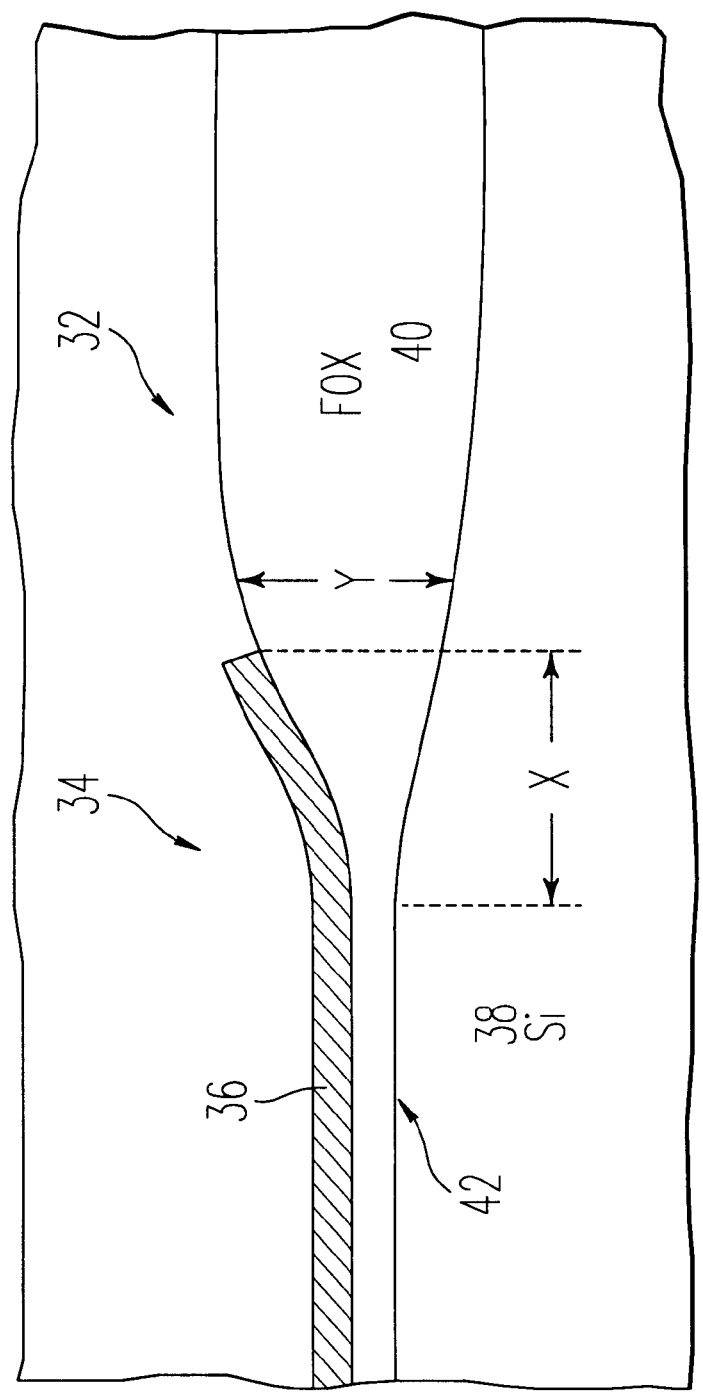
FIG. 4 illustrates a bird's beak produced during the conventional LOCOS process.

The present invention provides a method of forming an isolation region in a semiconductor die. The main objectives of the present method are to reduce field oxide thinning in narrow areas and the bird's beak encroachment. The method is particularly suitable for VLSI and larger scale devices where circuits are densely packed on a semiconductor die. The present invention reduces the field oxide thinning in narrow regions which provides for effective isolation (e.g. prevents leakage) between adjacent devices as the geometries are reduced. It also minimizes bird's beak encroachment of a local oxidation so that the space required for isolation regions between devices on a semiconductor die can be minimized. An additional advantage of this scheme is that it is free from stress related defects and KOOI defects.

Referring to FIGS. 5(*a*)–(*d*), the semiconductor device according to the present invention may be formed on any semiconductor substrate 52 conventionally known to those of ordinary skill in the art. Non-limiting examples of substrates 52 include silicon, gallium arsenide, silicon on sapphire (SOS), germanium, germanium silicon, diamond and silicon on insulator (SOI) material. Such substrates may be formed epitaxially in accordance with conventional techniques. Doping techniques known to those of ordinary skill in the art may be used to adjust the conductivity properties of the semiconductor substrate. Preferably the substrate comprises Si, and more preferably consists essentially of Si or Si conventionally doped with P-type or N-type dopant.

The pad oxide material 54 may be one conventionally known to those of ordinary skill in the art. Non-limiting examples include silicon dioxide and silicon oxynitride ($SiO_xN_y$). Accordingly, the pad oxide material may not necessarily be an oxide, but simply function as an insulation layer between the oxidation mask and the substrate. The pad oxide material 54 may be modified by the addition of boron, phosphorous or both. $SiO_2$ and $SiO_2$-based films can be formed from thermal oxides; silane, tetraethoxysilane, borophosphosilicate glass and spin-on-glass. Preferably, the pad oxide material comprises silicon dioxide grown on silicon.

Oxidation mask materials for use in the present invention include those known to those of ordinary skill in the art which acts as a barrier to oxidation of an underlying layer. Suitable mask materials may include a metal nitride layer, such as silicon nitride ($Si_3N_4$). $Si_3N_4$ layers may be formed by conventional methods known to those of ordinary skill in the art, such as by chemical vapor deposition techniques. The thickness of the mask may be that sufficient to inhibit oxidation of the material covered by the mask.

Referring to FIGS. 5(a)–5(d), a processing sequence for a semiconductor die 50 according to one embodiment of the present invention is illustrated.

Semiconductor die 50 includes a substrate 52 and a layer 54 of pad oxide which has been grown over substrate 52, for example by thermal oxidation. The pad oxide layer 54 may or may not contain dopants such as boron, phosphorous, arsenic and/or a halogen (such as fluorine and/or chlorine). The thickness of the pad oxide layer 54 may be approximately 20–200 Å, preferably 30–150 Å, more preferably 50–100 Å thick. Pad oxide layer 54 acts as a stress buffer during the growth of the field oxide in a later process step. Also shown in FIG. 5 is an oxidation mask layer 56 which has been deposited over the pad layer 54, for example by conventional chemical vapor deposition techniques. The thickness of the of oxidation mask 56 may be from 100 to 3,000 Å, preferably from 200 to 2,000 Å, more preferably from 1,000 to 2,000 Å. In a specific embodiment, the oxidation mask layer is about 1,500 Å thick.

As shown in FIG. 5(c), conventional lithography and plasma dry etching (or other similar techniques) may be employed to pattern the oxidation mask layer 56 to expose one or more isolation regions in the silicon substrate 52 where isolation structures are to be formed. These steps may be carried out by forming (e.g., by spinning on), patterning (e.g., by irradiating through a photolithographic mask) and developing (e.g. by immersing in a conventional developing solvent) a photoresist layer (not shown) prior to etching. Each of the forming, patterning and developing steps may be conducted in a conventional manner, such as by those methods known to those of ordinary skill in the art.

The oxidation mask layer 56 may be then removed from the isolation region, e.g., by a conventional dry etch process (e.g., using a plasma comprising a gas such as a halogenated hydrocarbon compound and/or mixtures thereof [e.g., $C_nF_xH_y$] where n=1–4, preferably 1–2; n≦x≦(2n+2), preferably 2n≦x≦2n+2; and 0≦y<≦n+2; preferably 0≦y≦2; such that x+y=2n or (2n+2), preferably (2n+2)). The result is typically an anisotropic etch of the oxidation mask material to produce nearly vertical sidewalls.

The etch may then be continued (optionally after changing the etch chemistry to one more suitable for etching $SiO_2$ than etching $Si_3N_4$), to etch through the exposed pad oxide layer and expose the isolation region of the substrate. After etching, the pad oxide has a sidewall 68 that may have a slope which is: (i) the same as the slope of the oxidation mask layer sidewalls, (ii) the same as the slope of the substrate sidewall 66, (iii) a value between the slopes of the oxidation mask and substrate sidewalls, or (iv) any combination thereof (e.g., a curve).

If desired, the etchant may be again changed to one(s) suitable and/or conventional for etching the substrate, the depth of the substrate etch may be from 100 to 1,000 Å, preferably from 200 to 800 Å more preferably from 250 to 750 Å. In one embodiment, this depth is approximately 500 Å. The etch chemistry and conditions are selected to produce different sidewall slopes (slope 1 and slope 2) for the oxidation mask layer 56 and the substrate 52 in the vicinity of the isolation regions. This results in a tapered recess 58 being formed in the substrate 52. The tapered recess 58 has a sidewall with an angle φ (see FIG. 6) of approximately 10 to 40° with respect to the nearly vertical axis of the sidewall of the oxidation mask layer (slope 2). For example, the oxidation mask sidewall 56 may have an angle of 85 to 90° as measured from the substantially planar horizontal surface of the oxidation mask layer. A more preferred φ for the sidewall slope of the tapered recess 58 is in the range of 30 to 40° as measured from the vertical axis of the oxidation mask sidewall.

The etching technique used in the present invention, for one embodiment, uses an etchant gas system of $C_2F_6$ and $CHF_3$ at a chamber pressure of from approximately 10 to approximately 2,000 torr, for a period of time of approximately 50–60 seconds. Other suitable etchant gases include $SF_6$, $O_2$, $CF_4$, $C_3F_8$, $C_2H_2F_4$, and $C_2HF_5$. Still other suitable etchant gas systems which use a fluorine- or chloride-based chemistry may be used to achieve the same desirable results. However, the most preferred etchant for forming a sloped or tapered recess in the substrate and in the pad oxide when the pad oxide sidewall has a slope similar to that of the substrate sidewall, include at least in part, fluorocarbon- and/or hydrofluorocarbon based etchants.

As shown in FIG. 5(d), after the tapered recess 58 has been formed, a field oxide region 60 of from 2,000 to 10,000 Å, preferably 2,500 to 8,000 Å, more preferably 3,000 to 7,500 Å (and in one embodiment approximately 5,000 Å). The dimensions of the field oxide are measured from "beak to beak" of a field oxide connecting two active regions. The field oxide may be grown at a temperature of from 850 to 1,250° C., preferably 900–1,225° C., more preferably 1,075– 1,200° C. (and in one embodiment approximately 1,100° C.) for a time period sufficient to grow the field oxide to a thickness effective to electronically isolate adjacent active regions (e.g., from 2 to 16 h, preferably 4–12 h, and in a specific embodiment approximately 8 hours) in a dry atmosphere ambient or environment comprising a gaseous oxidant (e.g., $O_2$, NO, $N_xO_y$, etc. that may further comprise an inert carrier gas such as $N_2$, He, Ar, etc.). Preferably the dry atmosphere comprises $O_2$. During this growth step, the chamber pressure may be any suitable value effective to grow an electrically effective field oxide region (e.g., one which electrically isolates adjacent active regions). The pressure preferably is selected from the following ranges: 1.5 atm or less, 3 atm or less, and less than 5 atm. Such low pressure helps to reduce thinning of the field oxide. Preferably, a field oxide region formed by the present method had a thickness at least 5%, more preferably at least 10%, greater than that of an otherwise ideatical field oxide formed by an otherwise identical growing step performed at a pressure of 25 atm and a temperature of 1,000° C. After the oxide is grown to a desired thickness, the oxidation mask layer 56 may be removed by conventional wet etching techniques.

The amount of water present during the dry oxidation process (typically formed in situ by reaction of gaseous hydrogen and oxygen) should be limited to ≦100 ppm, preferably ≦70 ppm, more preferably ≦50 ppm.

In particular, FIG. 5(b) illustrates semiconductor die 50 after oxidation mask layer 56 has been patterned and etched in accordance with the present invention, whereby leaving sidewall 64 adjacent to an isolation region 62 underlying pad oxide layer 54. The sidewall 64 is preferably nearly vertical (e.g., having a slope of 85–90° relative to the horizontal surface of oxidation mask layer 56). In later processing steps (not shown), active areas (such as implant regions, transistor gates, interconnect structures and metal [bus] lines) may be formed in or on semiconductor die 50 in or over regions of substrate 52 covered by the remaining regions of oxidation mask layer 56. These active areas may be formed by conventional CMOS and a capitalizing processing or other semiconductor and/or integrated circuit processing techniques.

In one embodiment, the etch which was started in FIG. 5(b) is continued to etch the pad oxide and, after changing the etch chemistry as described above, to etch the substrate. The result is the formation of one or more tapered recesses 58 in the substrate 52 (see FIG. 5(c)). The tapered recesses 58 are formed in the isolation region 62 which were exposed after the etch of the oxidation mask layer 56 and/or pad oxide layer 54. Notice the sidewall 66 of the tapered recess 58 has a different slope (slope 2) than the slope (slope 1) of the nearly vertical sidewall 64 of the oxidation mask layer 56.

After the substrate 52 has been etched to the desired depth, the field oxide is grown in the isolation region (i.e., tapered recess 58). The oxide growth is carried out in a dry, oxidizing environment as discussed above. The method(s) of the present invention dramatically reduce the oxide thinning and the bird's beak encroachment that may occur during a field oxide growing step.

During the oxidation of the substrate 52, the volume of substrate oxide expands greatly from the corresponding unoxidized volume of substrate. The substrate oxide grows in both the vertical and the horizontal directions at least in part because the gaseous oxidants diffuse through oxide to react with underlying substrate. In a preferred embodiment, during the oxidation process, the substrate oxide expands less in the lateral direction due to the diffusion barrier properties of the oxidation mask layer 56 on top of the substrate 52. The oxidation mask layer 56 therefore suppresses the lateral growth of the oxide. The lateral growth of the oxide under the oxidation mask layer 56 may be limited when the oxidizing species is a dry oxidant such as oxygen. Further, the sloped surface on the sidewall 66 of the substrate layer 52 presents additional area for vertical oxide growth than would be the case in the absence of the sloped sidewall. This also helps to minimize the lateral growth of the oxide under the oxidation mask layer 56.

In a preferred embodiment, neither the sidewall of said substrate nor the sidewall of said oxide pad undercut the vertical plane defined by the sidewall of said oxidation mask.

Figure 6:
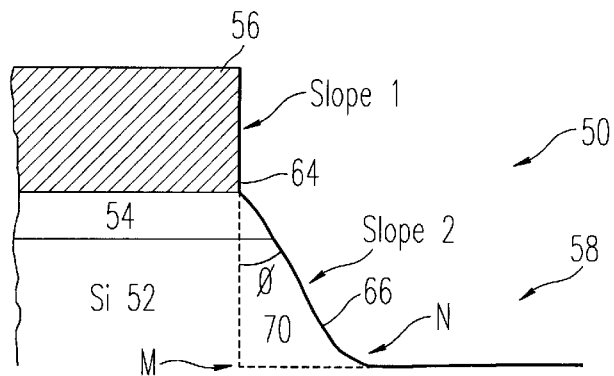
FIG. 6 highlights the sloped sidewall of the semiconductor substrate of the die illustrated in FIG. 5(*c*)

FIG. 6 further illustrates this concept. As shown, the tapered recessed 58 in the substrate 52 has a sloped sidewall 66. The sloped sidewall 66 forms an angle $\phi$ with a vertical axis as defined by the nearly vertical sidewall 64 of the oxidation mask layer 56. Preferably, $\phi$ is between approximately 10° and approximately 40° and, more preferably, is between approximately 30° and 40°. If the LOCOS process had been performed according to conventional, non-sloped techniques, during oxidation, field oxide would begin growing at point M (see FIG. 6). However, during oxidation, field oxide may begin growing at point N in the tapered recess 58 provided by the present invention. In effect, the field oxide has been provided with an effective area 70 over which to grow during the oxidation step. The presence of this area 70 (which is not available in conventional LOCOS processing techniques), coupled with a relatively small lateral oxidation rate (as compared to vertical oxidation) for dry oxidants such as oxygen, reduces the encroachment of oxide under the oxidation mask layer 56, thus dramatically reducing or eliminating bird's beak.

Figure 7:
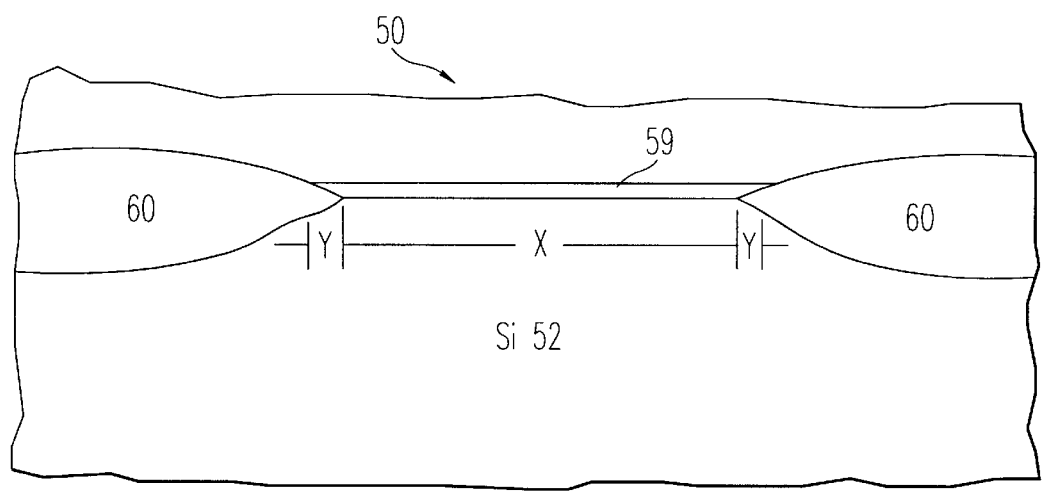
FIG. 7 illustrates the reduction in bird's beak achieved according to one embodiment of the present invention.

The position difference between N and M can be expressed as $$\tfrac{1}{2}(A-B)$$

where A is the diameter of a circular photoresist opening for the masking step of the oxidation mask layer 56 and B is the diameter of the base of the tapered recess opening. The starting point of oxidation in the tapered recess 58, i.e., the lowest point in the silicon 52, is therefore at an offset, i.e., $\tfrac{1}{2}(A-B)$, away from that in the vertical recess opening of the photoresist for the masking step of oxidation mask layer 56. As a result, different lateral expansions are obtained in the tapered recess 58 using the methods of the present invention than would be obtained in a vertical recess opening using LOCOS methods of the past. The bird's beak length y, shown in FIG. 7, it therefore substantially less than the bird's beak length formed by conventional isolation processes.

The above-described slope of substrate sidewall (slope 2) has been described relative to the nearly vertical slope of said oxidation mask sidewall. It is to be understood that the present invention may be described in terms relative to a plane perpendicular to the interface between said substrate and said oxide pad. Accordingly, the sidewall of the oxidation mask will be perpendicular to the plane defined by the interface between said substrate and said oxide pad ±5°, while the slope of said substrate sidewall will be from 50 to 80°, preferably from 50 to 60° relative to the plane defined by the interface between said substrate and said oxide pad.

The difference between a field oxide with conventional thinning and one with reduced thinning according to the invention, may be better understood by reference to FIGS. 8(a) and 8(b). The dimensions "x" and "y" in each illustration depicts the length and height of each of the field oxide regions. Where thinning is reduced, the corresponding "y" dimension is greater than when conventional thinning occurs. The effect is greater when the horizontal dimensions are smaller. Accordingly, in FIGS. 8(a) and 8(b), for a given dimension $x_2$ greater than $x_1$, it follows that the dimension $y_2$ is greater than $y_1$ and the dimension $y_4$ is greater than $y_3$ for a given set of oxide growth conditions. However, "reduced thinning" for a given process comparision refers to when the difference $(y_2-y_1)$ is greater than the difference $(y_4-y_3)$, and/or the ratio $y_3/y_1$ is greater than the ratio $y_4/y_2$. The result is that a greater isolation value is obtained for the same amount of horizontal surface area of the semiconductor substrate as compared with a field oxide exhibiting conventional thinning. This also allows for the design of a field oxide region having an equivalent isolation value while occupying less horizontal surface area of the semiconductor substrate, and for the design of semiconductor devices of even smaller horizontal dimensions.

In a preferred embodiment, the "y" dimension of field oxide/isolation structures produced by the present method are $\geq 5\%$, more preferably $\geq 10\%$, even more preferably $\geq 15\%$ greater than the dimension "y" which would be obtained by oxidation of the same substrate using conventional wet oxidation techniques or a dry high pressure technique (e.g., at 15 atmospheres $O_2$, 1,050° C., for 2 hours).

In preferred embodiments, the dimensions "$x_1$" and "$x_2$" are $\geq 0.18$ $\mu$m, more preferably $\geq 0.25$ $\mu$m or $\geq 0.30$ $\mu$m. In addition, the dimensions "$x_1$" and "$x_2$" are preferably $\leq 0.65$ $\mu$m, more preferably $\leq 0.50$ $\mu$m, even more preferably $\leq 0.40$ $\mu$m. One advantage of the present invention is that thinning is more greatly reduced for relatively narrow field oxide bodies (e.g., having a width "$x_1$") than for relatively large field oxide bodies (e.g., having a width "$x_2$"). Thus, in certain embodiments, "$x_1$" and "$x_2$" may be chosen such that $x_1 \leq 0.50$ $\mu$m$<x_2$, $x_1 \leq 0.35$ $\mu$m$<x_2$, or $x_1 \leq 0.30$ $\mu$m$<x_2$. As a result, the thickness of field oxide body 60 "$y_3$" may be at least 5% greater than "$y_1$" (i.e., $y_3 \geq 1.05\ y_1$, $y_3 \geq 1.10\ y_1$, or $y_3 \geq 1.15\ y_1$). On the other hand, the thickness of field oxide body 61 "$y_4$" may be at least 3% greater than "$y_2$" (i.e., $y_4 \geq 1.03\ y_2$, $y_4 \geq 1.05\ y_2$ or $y_4 \geq 1.07\ y_4$).

In one example of the present method, with the field oxide having a width "x" and a thickness "$y_3$"=5,000–6,000 Å, the thinning is only 7–8%. By contrast, conventional wet oxidation, with a field oxide of identical dimensions, results in thinning of 20–25%. Furthermore, the results of high pressure oxidation under the conditions described above are similar to the results of conventional wet oxidation (approximately 20%).

Thus, a novel method and structure for isolating integrated circuit components and/or semiconductor elements have been described. In the foregoing description references were made to certain specific illustrated embodiments, however, those skilled in the art will appreciate that the present invention may be applied to a wide number of isolation structures in semiconductor dies and, accordingly the present in invention should be measured only in terms of claims which follow.

What is claimed as new and is desired to be secured by Letters Patent of the United States is:

1. A method of forming a field oxide region in a semiconductor comprising:
    etching a semiconductor substrate to form a tapered recess in said substrate, said substrate having an oxide layer disposed thereover and an oxidation mask layer disposed over said oxide layer, said oxidation mask layer having a first sidewall, said substrate having a second sidewall sloped with respect to said first sidewall; and
    oxidizing said substrate in said tapered recess in a dry oxidizing atmosphere to form a field oxide region.

2. The method of claim 1, wherein said oxidizing is performed at a temperature of from 850–1,250° C. for a length of time effective to isolate active regions of said substrate adjacent to said field oxide region.

3. The method of claim 1, wherein said etching comprises dry etching.

4. The method of claim 1, wherein said second sloped sidewall has a slope of approximately 10–40° with respect to said first sidewall.

5. The method of claim 4, wherein said etching step comprises plasma etching with one or more fluorocarbon-based etchants.

6. The method of claim 1, further comprising prior to said etching step, the steps of:
    patterning and dry etching said oxidation mask layer and said oxide layer to expose a portion of said substrate to be etched.

7. The method of claim 1 wherein said substrate is etched to a depth of from 100 to 1,000 Å below an interface between said substrate and said oxide layer.

8. The method of claim 1, wherein said substrate comprises Si, said oxide layer comprises $SiO_2$ and said oxidation mask comprises silicon nitride.

9. The method of claim 1, wherein said dry oxidizing atmosphere comprises $O_2$.

10. The method of claim 1, wherein said oxidizing is conducted at a pressure $\leq 5$ atm.

11. The method of claim 1, wherein said oxidizing is conducted at a temperature of from 900 to 1,200° C.

12. The method of claim 1, wherein said oxidizing is conducted at a temperature of from 1,000 to 1,200° C.

13. The method of claim 1, wherein said oxidation mask layer has a thickness of 100–3,000 Å.

14. The method of claim 1, wherein said oxidation mask layer has a thickness of 200–2,000 Å.

15. The method of claim 1, wherein said oxidation mask layer has a thickness of 500–2,000 Å.

16. The method of claim 1, wherein said pad oxide layer has a thickness of 20–200 Å.

17. The method of claim 1, wherein said pad oxide layer has a thickness of 30–150 Å.

18. The method of claim 1, wherein said pad oxide layer has a thickness of 50–100 Å.

19. A semiconductor wafer or die having a field oxide region thereon formed by the method of claim 1.

20. The method of claim 1, wherein said oxidizing is conducted at a pressure of $\leq 3$ atm.

* * * * *